US006651732B2

(12) United States Patent
Sagal

(10) Patent No.: US 6,651,732 B2
(45) Date of Patent: Nov. 25, 2003

(54) THERMALLY CONDUCTIVE ELASTOMERIC HEAT DISSIPATION ASSEMBLY WITH SNAP-IN HEAT TRANSFER CONDUIT

(75) Inventor: E. Mikhail Sagal, Narragansett, RI (US)

(73) Assignee: Cool Shield, Inc., Warwick, RI (US)

( * ) Notice: Subject to any disclaimer, the term of this patent is extended or adjusted under 35 U.S.C. 154(b) by 0 days.

(21) Appl. No.: 10/228,228

(22) Filed: Aug. 26, 2002

(65) Prior Publication Data

US 2003/0042005 A1 Mar. 6, 2003

Related U.S. Application Data

(60) Provisional application No. 60/316,483, filed on Aug. 31, 2001.

(51) Int. Cl.[7] .................................................. F28F 7/00
(52) U.S. Cl. ................. 165/80.3; 165/185; 165/104.33; 361/700; 174/15.2; 257/715
(58) Field of Search ............................... 165/185, 80.3, 165/104.33, 104.26; 361/697, 700, 704, 710; 257/706, 722, 714, 715

(56) References Cited

U.S. PATENT DOCUMENTS

| 4,900,877 | A |   | 2/1990  | Dubrow et al. |             |
|-----------|---|---|---------|---------------|-------------|
| 4,938,279 | A |   | 7/1990  | Betker        |             |
| 4,948,922 | A |   | 8/1990  | Varadan et al.|             |
| 4,999,741 | A |   | 3/1991  | Tyler         |             |
| 5,061,566 | A |   | 10/1991 | Morgan        |             |
| 5,115,104 | A |   | 5/1992  | Bunyan        |             |
| 5,187,225 | A |   | 2/1993  | Kitagawa      |             |
| 5,315,480 | A |   | 5/1994  | Samarov et al.|             |
| 5,402,160 | A | * | 3/1995  | Kadowaki et al.| 165/104.33 |
| 5,430,609 | A |   | 7/1995  | Kikinis       |             |
| 5,440,172 | A |   | 8/1995  | Sutrina       |             |
| 5,513,070 | A |   | 4/1996  | Xie et al.    |             |
| 5,552,960 | A |   | 9/1996  | Nelson et al. |             |
| 5,557,500 | A |   | 9/1996  | Baucom et al. |             |
| 5,572,070 | A |   | 11/1996 | Ross          |             |
| 5,660,917 | A | * | 8/1997  | Fujimori et al.| 428/195    |
| 5,738,936 | A |   | 4/1998  | Hanrahan      |             |
| 5,781,412 | A |   | 7/1998  | de Sorgo      |             |
| 5,790,376 | A |   | 8/1998  | Moore         |             |
| 5,910,524 | A |   | 6/1999  | Kalinoski     |             |
| 5,952,417 | A | * | 9/1999  | Chao et al.   | 524/451     |
| 5,983,995 | A | * | 11/1999 | Shutou et al. | 165/104.33  |
| 6,102,110 | A | * | 8/2000  | Julien et al. | 165/104.33  |
| 6,204,303 | B1|   | 3/2001  | Osuna et al.  |             |
| 6,348,654 | B1|   | 2/2002  | Zhang et al.  |             |
| 6,374,905 | B1| * | 4/2002  | Tantoush      | 165/80.3    |
| 6,385,047 | B1| * | 5/2002  | McCullough et al.| 361/704  |
| 6,397,941 | B1| * | 6/2002  | McCullough    | 165/185     |
| 6,408,935 | B1| * | 6/2002  | Dehoff et al. | 165/80.3    |
| 6,410,137 | B1|   | 6/2002  | Bunyan        |             |
| 2003/0000689 | A1| * | 1/2003 | Kuo et al.    | 165/185     |

* cited by examiner

*Primary Examiner*—Terrell McKinnon
(74) *Attorney, Agent, or Firm*—Barlow, Josephs & Holmes, Ltd.

(57) ABSTRACT

A composite heat dissipation assembly having a net shape injection molded thermally conductive elastomeric heat sink and at least one integral heat pipe is provided in the present invention. The molded conformable heat sink is formed from a base elastomeric material that is loaded with thermally conductive filler. The base material is mixed with the filler and net shape molded to form the outer geometry of the assembly. Within the geometry of the part an integral channel is formed that is capable of receiving a heat pipe. The channel is formed to have an opening that is slightly smaller than the outer cross-sectional dimensions of the heat pipe. When the heat pipe is pressed into the channel a portion of the elastomeric material is compressed and the reactionary force of the compressed material firmly presses the elastomer into thermal communication with the outer surface of the heat pipe. In addition, the manner in which the elastomer mates to the surface of the heat pipe reduces junction resistance between the surface of the heat pipe and the outer component, thereby eliminating the need to use glue or conformable thermal interface to assemble the part.

17 Claims, 1 Drawing Sheet

THERMALLY CONDUCTIVE ELASTOMERIC HEAT DISSIPATION ASSEMBLY WITH SNAP-IN HEAT TRANSFER CONDUIT

CROSS-REFERENCE TO RELATED APPLICATIONS

This application is related to and claims priority from earlier filed provisional patent application No. 60/316,483, filed Aug. 31, 2001.

BACKGROUND OF THE INVENTION

The present invention relates generally to a new composite assembly for transferring heat generated within electronic devices from areas of high heat generation potential to areas of high heat dissipation potential. More specifically, this invention relates to an injection molded thermally conductive elastomeric part having an integral pocket for receiving a heat pipe component.

In the electronics industry, there are various parts and components, which generate heat during operation. For example, it is well known that most computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation, which must be removed to prevent adverse effects on operation of the system into which the device is installed. For example, a PENTIUM microprocessor, containing millions of transistors, is highly susceptible to overheating, which could destroy the microprocessor device itself or other components proximal to the microprocessor.

There are a number of prior art methods to cool heat generating components and objects to avoid device failure and overheating, as discussed above. A block heat sink or heat spreader is commonly placed into thermal communication with the heat-generating surface of the object to absorb and dissipate the heat therefrom. Such a heat sink typically includes a base member with a number of individual cooling members, such as fins, posts or pins, to assist in the dissipation of heat. The geometry of the cooling members is designed to increase the total surface area of the heat sink that is in contact with the ambient air for optimal heat dissipation. The use of such fins, posts of pins in an optimal geometrical configuration greatly enhances heat dissipation compared to devices with no such additional cooling members, such as a flat heat spreader.

To further enhance the overall heat dissipation of an assembly, fans have been installed either internally or externally to increase the airflow over the heat dissipation device. However, these devices consume power and have numerous moving parts. As a result, heat sink assemblies with this type of active devices are subject to failure and are much less reliable than a device that is solely passive in nature.

It has been discovered that as an alternative to the active cooling devices described above, more efficient cooling of electronics can be obtained using passive heat pipes that require no external power source and contain no moving parts. Heat pipes of this type are well-known devices that are employed for efficiently moving heat from one place to another. Generally, the heat pipe is in the form a vacuum-tight vessel having a particular geometric shape, which is evacuated and partially filled with a working fluid. The heat pipe passively transfers heat from a heat source to a heat sink where heat is dissipated. As the heat is conducted into the heat pipe from the heat-generating source, the fluid is vaporized in an evaporator section causing a pressure gradient to develop in the heat pipe. This gradient forces the vapor to flow along the heat pipe to the condenser section, where the vaporized fluid condenses back to its liquid state by giving up its latent heat of vaporization. The working fluid in a liquid state is then returned to the evaporator section to repeat the process of removing the heat generated by the heat source. One method used to achieve cooling by use of a heat pipe places the evaporator section at the lower end and the condenser section at the upper end where the heat pipe is in a substantially vertical position. Once the working fluid has been condensed, the liquid flows by gravity back to the evaporator section. In addition, internal wick structures may be used to assist liquid flow back to the evaporator section through capillary action thereby reducing the effect of gravity on the device.

Alternatively, the heat pipe may be simply filled with the working fluid to create a vapor chamber therein when the liquid is heated by the heat-generating object to its vaporization point. It is well known in the prior art that vaporized water or ammonia is highly thermally conductive and greatly facilitates the transfer of heat.

While heat pipes are highly effective for transferring heat from one point to another, heat pipes are typically tubular in configuration and do not interface well with objects to be cooled. Further, heat pipes, due to their tubular configuration, do not have a significant surface area, preventing them from interfacing well with the ambient air for dissipation of heat. For example, a typical heat pipe may be a tube having a diameter of less than a centimeter while the object to be cooled may be a microprocessor, which is two inches square in shape. Due to the severe mismatch in geometry, affixing such a heat pipe to a microprocessor results in a very inefficient transfer of heat from the large heat generating surface to the small surface area, about one side of the diameter, of a heat pipe. Further, the exposure of the free end, not connected to a heat generating object, to the ambient air is also inefficient because the surface area of the diameter of the heat pipe is relatively small thus making the dissipation of heat even more inefficient.

In order to enhance the efficiency for the interface ends of the heat pipe, it is desirable to cast a heat sink assembly or overmold a thermally conductive configuration about the heat pipe to increase the overall contact surface area. However, in so doing, there is a serious risk of damage to the heat pipe during the casting or molding process. If the casing of the heat pipe is cracked or split during formation of the overmolded configuration, the heat pipe media will leak and the heat pipe will not operate properly, resulting in a deleterious effect on the thermal conductivity of the overall heat dissipation device.

In view of the foregoing, there is a demand for a heat pipe construction and a method for manufacturing such a construction that is less expensive than the prior art yet provides superior heat dissipation. There is a demand for a passive heat pipe construction with no moving parts that can provide heat dissipation without the use of active components. In addition, there is a demand for a method of manufacturing a heat pipe construction that enables a heat pipe to be incorporated into an assembly that includes additional heat dissipating material, without the risk of damage to the heat pipe itself.

SUMMARY OF THE INVENTION

In this regard, in accordance with the present invention, a composite assembly that has the capacity to conduct heat from an area of high heat generating potential to an area of high heat dissipation potential is provided. One component of the part is net shape injection molded from a thermally conductive elastomeric material to create the required geometry for the proper interfacing and heat dissipating configurations and has an integrally molded channel to receive a heat pipe. The molded component is formed from a base elastomeric matrix material that is loaded with thermally conductive filler. The base material is mixed with the filler and injected into a mold cavity to form the outer geometry of the assembly. Within the geometry of the part an integral channel is formed that is capable of receiving a heat pipe. Since the heat pipe channel is formed in the elastomeric composite, the walls of the channel have resilient and conformable properties.

The geometry of the channel is formed in such a manner so as to have an opening that is slightly smaller that the outer cross-sectional dimensions of the heat pipe. When the heat pipe is pressed into the channel a portion of the elastomeric material is compressed and the reactionary force of the compressed material firmly presses the elastomer into thermal communication with the outer surface of the heat pipe. This allows the outer component of the assembly to be net shape molded into virtually any required geometric configuration, including very thin profiles that were previously unattainable in the prior art using traditional over molding methods. In addition, the manner in which the elastomer mates to the surface of the heat pipe reduces junction resistance between the surface of the heat pipe and the outer component, thereby eliminating the need to use thermally conductive glues, greases or conformable thermal interfaces to assemble the part.

Another feature of the present invention is the fact that the elastomeric portion of the present invention has geometry that is flexible and conformable. This allows the construction of a flexible heat pipe assembly that is quite useful in compact assemblies with limited space through which to conduct waste heat. Also, the conformability of the elastomeric material allows it to be installed directly in contact with the heat generating surface and the heat-dissipating surface without the additional requirement of an interface pad. The elastomeric material is capable of overcoming and conforming to the slight surface imperfections that occur from the fabrication techniques of those surfaces thus resulting in superior thermal interface.

Further, the method used in manufacturing the present invention is superior In that it eliminates several steps as compared to the prior art. By first net shape molding the outer component into the desired geometric configuration additional steps associated with machining and polishing the parts into the finished shape are eliminated. Also, by pressing the heat pipe into the conformable channel after the part is formed, the heat pipe can be fully charged before incorporation into the assembly.

A single heat pipe is preferably employed but multiple heat pipes may be embedded within the construction of the present invention. Alternatively, other heat transfer conduits may be employed instead of a heat pipe, such as copper rods or formed copper strands. In addition, optional flat contact ends are can be provided in the overall part geometry proximal to where the ends of the heat pipe reside in its installed position to achieve greatly improved thermal interface results in a manner that is far less expensive than soldering a heat pipe to a heat spreader.

It is therefore an object of the present invention to provide an improved composite heat dissipation composite assembly that can provide enhanced heat dissipation for a heat generating component or object. It is a further object of the present invention to provide a heat pipe construction device that has no moving parts. Another object of the present invention is to provide a composite heat pipe construction that is completely passive and does not consume power. A further object of the present invention is to provide a heat pipe construction that inexpensive to manufacture. It is yet another object of the present invention to provide a conformable elastomeric heat sink geometry into which a heat pipe can be installed after the part is molded with out the requirement of thermal interfaces or adhesives. A further object of the present invention is to provide a method of manufacturing a conformable composite heat pipe construction that is moldable and is easy to assemble manufacture.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

DETAILED DESCRIPTION OF THE INVENTION

Figure 1:
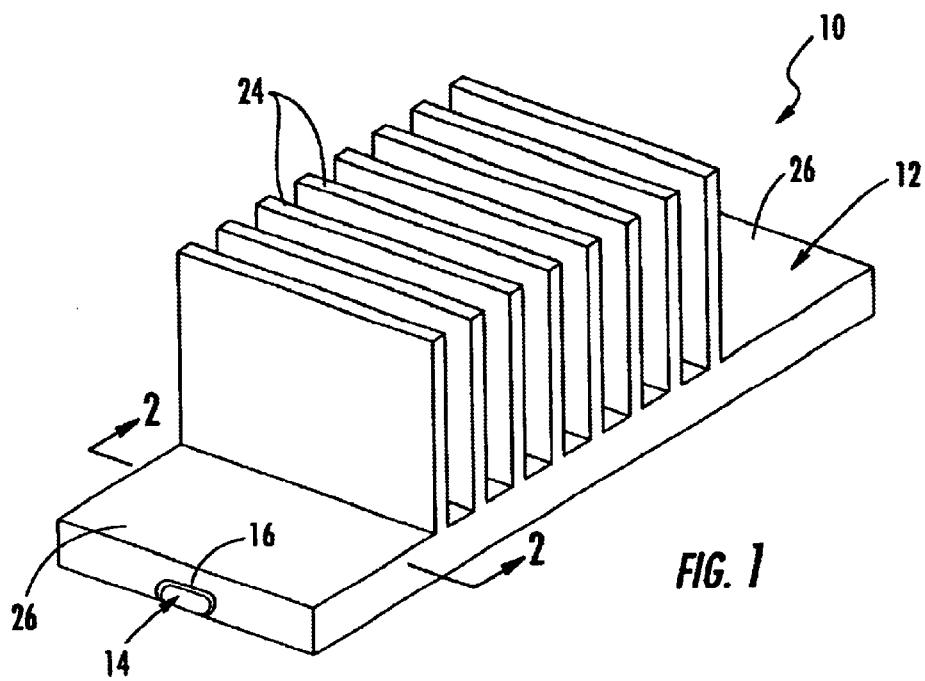
FIG. 1 is a perspective view of the composite heat dissipation assembly of the present.
Figure 2:
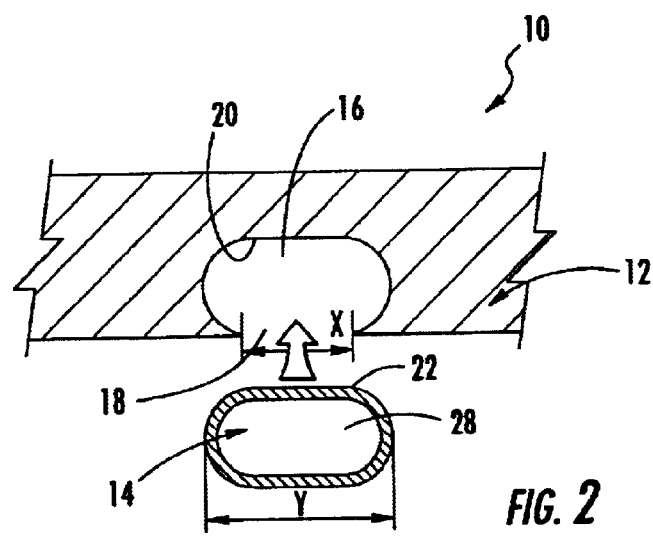
FIG. 2 is a cross-sectional view thereof taken along the line 2—2 of FIG. 1 with the heat pipe element not installed.
Figure 3:
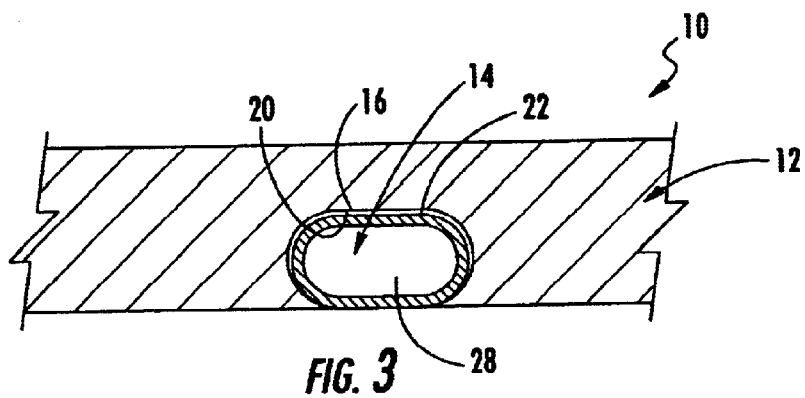
FIG. 3 is a cross-sectional view thereof taken along the line 2—2 of FIG. 1 with the heat pipe element installed.

Referring now to the drawings, the composite heat dissipation device of the present invention is illustrated and generally indicated as 10 in FIGS. 1–3. Turning to FIG. 1, the present invention generally includes two major components, the first is a molded heat sink portion 12 and the second is a heat pipe 14. As will hereinafter be more fully described, the heat sink portion 12 (elastomeric component) is formed from a thermally conductive elastomeric composition and includes an integrally formed channel 16 to receive the heat pipe element 14. The method of the present invention, as will be fully described below, includes net shape molding the elastomeric composition 12 and installing the heat pipe element 14 therein. The present invention therefore provides a novel composite heat dissipation device 10 that includes at least one integral heat pipe element 14 that reduces the potential for manufacturing defects while providing an economical heat dissipation device 10 that has not been previously available in the prior art.

The elastomeric component 12 of the present invention is injected molded from a net shape moldable thermally conductive elastomer composition. The elastomer composition includes a base elastomeric matrix material that is filled with a thermally conductive filler material such as carbon, boron nitride, alumina, metallic flakes, crushed glass or a combination thereof. As the molded component 12 of the present invention 10 is molded from elastomeric material, it is lighter than the prior art metallic interface pad materials previously employed. In addition, the present invention 10 also has the advantage of being net shape moldable, meaning, the part that is created in the injection molding process does not require any further processing steps after it is removed from the mold and before it is incorporated into the finished device. Both the lighter weight and the net-shape moldability are distinct advantages over the prior art where metallic parts had to be machined in several steps and subsequently soldered to the heat pipe to achieve the desired part geometry.

The elastomeric component 12 is molded to specifically include at least one channel 16 therein that is designed to receive and frictionally retain the heat pipe element 14. Turning now to FIGS. 2 and 3, the channel 16 is formed in such a manner so as to have an opening 18 width X that is slightly smaller that the outer cross-sectional dimensions Y of the heat pipe 14. When the heat pipe 14 is pressed into the channel 16 a portion of the elastomeric material that forms the walls 20 of the channel 16 is compressed and the reactionary force of the compressed material 20 firmly presses the elastomer back against the outer wall 22 of the tubular heat pipe 14 and into thermal communication with the outer surface 22 of the heat pipe 14. Due to the firm contact, the heat pipe 14 is retained without requiring that an adhesive be employed. Since the elastomeric element 12 and the surface 22 of the heat pipe 14 are in firm intimate contact, the junction resistance is greatly reduced facilitating lowered thermal resistivity between the two elements 12, 14. Further, the need for additional thermal interface materials, such as glues or greases, is eliminated because the intimate contact between the conformable elastomeric material 12 and the outer surface 22 of the heat pipe 14 molds to fill any gaps or voids.

Turning back to FIG. 1, some of the surfaces of the elastomeric component 12 of the heat dissipation assembly 10 may also be articulated in such a manner as to increase the surface area to increase the part's ability to dissipate heat. These articulations may simply be areas where the parts overall dimensions are increased forming a heat spreader. Larger surface area articulations may also include the fins 24 shown in FIG. 1, or rods or pins as are previously well known in the relevant art. Other articulations in the geometry of the elastomeric component 12 may include integrally formed interface pads 26. These pads 26 are included to provide an area where the present invention 10 can be placed into intimate contact with the heat generating surface of an electronic component (not shown) or an additional heat sink (not shown) for additional heat dissipation capacity. Due to the conformability of the elastomeric material, the heat dissipation assembly 10 can be installed directly in contact with the heat generating and the heat-dissipating surfaces without the requirement of an additional interface pad. The conformability of the elastomeric material allows it to overcome and conform to the slight surface imperfections that occur from the fabrication techniques of those surfaces thus resulting in superior overall thermal interface.

The heat pipe component 14 of the present invention is a tubular pipe that is preferably made of metal, such as aluminum or copper. Other suitable materials for heat pipes, which are know in the art, may be employed in the present method. The tubular pipe 14 is shown in FIG. 1 as a straight; however, other shapes and configurations may be employed, such as a flattened U-shaped tubular pipe, and still be within the scope of the present invention. The elastomeric component 12 may also accommodate heat transfer conduits other than a heat pipe 14. For example, the channel 20 may be configured to receive a copper rod or a molded carbon fiber rod. In certain environments, heat pipes may not be appropriate. Further, additional channels 16 may be provided within the elastomeric component 12 to receive additional heat pipes 14 that would create multiple pathways across which heat could be transferred. This tubular pipe 14 is capable of retaining heat pipe media 28, such as water or ammonia, as will be discussed in detail below.

In the prior art, molding or casting around a delicate heat pipe 14 imparts significant pressure to the heat pipe 14 making it susceptible to damage during this operation. As stated above, if the heat pipe 14 is cracked or split during molding or casting of the heat sink assembly 10 the heat pipe media 28 contained within the heat pipe 14 will leak from the structure resulting in degradation of the performance of the heat pipe 14 construction. Therefore, in accordance with the present invention 10, the elastomeric component 12 is preformed before the heat pipe 14 is installed. The heat pipe component 14 is then simply pressed into the elastomeric element 12 after the molding is completed. In this manner, the heat pipe 14 is not subjected to any heating processes or molding pressures during assembly, thus allowing the heat pipe 14 to be charged with phase change media 28 before assembly into the elastomeric component 12.

The method of the present invention enables a composite heat dissipation assembly 10 to be manufactured where a heat pipe 14 is embedded within a heat sink configuration 12 where intimate thermal communication is obtained without the need for additional interfaces or adhesives. This desirable structure can be achieved without risk of damage to the embedded heat pipe 14. In the method of the present invention, a base elastomeric matrix is first provided. A thermally conductive filler such as alumina, boron nitride, carbon, metal flakes, crushed glass or combinations thereof is loaded into the base elastomeric matrix to form a thermally conductive elastomeric composite that is then molded in any molding method well known in the art. After the composition is cured, it is removed from the mold. A fully charged heat pipe 14 is then inserted into a channel 16 in the bottom of the elastomeric component 12 as described above. The completed assembly 10 is then ready for incorporation into the desired end device.

It should be understood that the specific geometric arrangements and applications shown in FIG. 1 are merely an example of the many different applications of the present invention 10 and are for illustration purposes only. The composite heat dissipation device 10 of the present invention is shown in a straight configuration; however, any configuration may be employed to suit the application and device environment at hand, such as Z-shaped or meandering configuration or a configuration that includes multiple heat pipes 14. Further, while there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A thermally conductive elastomeric composite heat dissipation assembly, comprising:
a thermally conductive body including an elastomeric base matrix loaded with a thermally conductive filler, said body including surface area enhancements and at least one channel, said channel having a bottom wall, having two side walls extending upwardly from said bottom wall, said side walls being spaced apart at a distance from one another, forming a lateral expandable opening therebetween;
interface pads, said interface pads being integrally formed with said outer component; and a sealed tubular pipe filled with a phase change media, said pipe having an outer diameter, said outer diameter being larger than said distance between said side walls of said channel, said tubular pipe placed into said lateral expandable opening between said side walls and frictionally retained in said channel.

2. The composite heat dissipation assembly of claim 1, wherein said thermally conductive outer component is net shape molded.

3. The composite heat dissipation assembly of claim 1, wherein said thermally conductive filler is selected from the group consisting of alumina, boron nitride, metal flakes, carbon and combinations thereof.

4. The composite heat dissipation assembly of claim 1, wherein said thermally conductive filler is boron nitride grains.

5. The composite heat dissipation assembly of claim 1, wherein said integrally formed surface area enhancements are selected from the group consisting of pins, fins and rods.

6. A composite heat dissipation assembly, comprising:

a thermally conductive body, said body being net shape molded from an elastomeric composite material loaded with a thermally conductive filler and defining at least one channel, said channel having a bottom wall, two side walls extending upwardly from said bottom wall, said side walls being spaced apart a distance from one another, forming a lateral expandable opening therebetween; and a heat transfer conduit having an outer dimension that is larger than the distance between said side walls, said heat transfer conduit placed into said channel through said lateral expandable opening between said side walls, said heat transfer conduit frictionally retained in said channel.

7. The composite heat dissipation assembly of claim 6, wherein said heat transfer conduit is a sealed tubular pipe filled with a phase change media.

8. The composite heat dissipation assembly of claim 6, wherein said thermally conductive filler is selected from the group consisting of alumina, boron nitride, metal flakes, carbon and combinations thereof.

9. The composite heat dissipation assembly of claim 6, wherein said thermally conductive filler is boron nitride grains.

10. The composite heat dissipation assembly of claim 6, wherein said geometry of said thermally conductive body further includes integrally formed surface area enhancements.

11. The composite heat dissipation assembly of claim 10, wherein said integrally formed surface area enhancements are selected from the group consisting of pins, fins and rods.

12. The composite heat dissipation assembly of claim 6, said body further comprising:

integrally formed conformable interface pads connected to said thermally conductive body.

13. A method of manufacturing a heat dissipation assembly, comprising the steps of:

net shape molding a thermally conductive elastomeric composite to form a thermally conductive body having at least one channel, said channel having a bottom wall and two resilient side walls extending upwardly from said bottom wall, said side walls being spaced apart from one another at a distance, forming a lateral expandable opening therebetween;

providing a sealed tubular pipe filled with a phase change media, said pipe having an outer diameter that is larger than the distance between said side walls;

laterally installing said tubular pipe into said channel by opening said lateral expandable opening between said side walls;

closing the expandable opening; and frictionally retaining said tubular pipe in said channel.

14. The method of claim 13, wherein said step of providing a sealed tubular pipe comprises providing a tubular pipe manufactured of metal.

15. The method of claim 13, wherein said phase change media in said sealed tubular pipe is water.

16. The method of claim 13, wherein said phase change media in said sealed tubular pipe is ammonia.

17. The method of claim 13, wherein said step of providing a sealed tubular pipe comprises providing a tubular pipe manufactured of metal.

* * * * *